United States Patent
Bedell et al.

(10) Patent No.: US 8,610,212 B2
(45) Date of Patent: Dec. 17, 2013

(54) SEMICONDUCTOR ACTIVE MATRIX ON BURIED INSULATOR

(75) Inventors: Stephen W. Bedell, Wappingers Falls, NY (US); Bahman Hekmatshoartabari, White Plains, NY (US); Devendra K. Sadana, Pleasantville, NY (US); Ghavam G. Shahidi, Pound Ridge, NY (US); Davood Shahrjerdi, White Plains, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/526,139

(22) Filed: Jun. 18, 2012

(65) Prior Publication Data

US 2013/0306971 A1  Nov. 21, 2013

Related U.S. Application Data

(63) Continuation of application No. 13/472,584, filed on May 16, 2012.

(51) Int. Cl.
*H01L 27/12* (2006.01)

(52) U.S. Cl.
USPC .......................................... 257/347

(58) Field of Classification Search
USPC .......................................... 257/347
See application file for complete search history.

(56) References Cited

U.S. PATENT DOCUMENTS

| | | |
|---|---|---|
| 5,868,951 A | 2/1999 | Schuck et al. |
| 5,919,606 A | 7/1999 | Kazlas et al. |
| 6,194,239 B1 | 2/2001 | Tayanaka |
| 6,720,198 B2 | 4/2004 | Yamagata et al. |
| 6,872,586 B2 | 3/2005 | Kiguchi et al. |
| 7,244,990 B2 * | 7/2007 | Takafuji et al. ............... 257/347 |
| 7,407,824 B2 | 8/2008 | Kerr et al. |
| 7,919,392 B2 * | 4/2011 | Takafuji et al. ............... 438/455 |
| 8,054,397 B2 | 11/2011 | Akimoto et al. |
| 8,115,883 B2 | 2/2012 | Yamazaki et al. |
| 8,339,563 B2 | 12/2012 | Huang |
| 8,378,344 B2 | 2/2013 | Sakakura et al. |
| 8,409,887 B2 | 4/2013 | Park et al. |
| 8,530,273 B2 | 9/2013 | Den Boer |
| 2002/0043693 A1 * | 4/2002 | Tiwari et al. ............... 257/392 |
| 2002/0142562 A1 * | 10/2002 | Chan et al. ............... 438/406 |

(Continued)

OTHER PUBLICATIONS

Ruzyllo, Jerzy "buried oxide, BOX" entry in Semiconductor Glossary available online at http://www.semi1source.com/glossary/default.asp?searchterm=buried+oxide%2C+BOX as of Mar. 24, 2013.*

(Continued)

*Primary Examiner* — Jae Lee
*Assistant Examiner* — Grant Withers
(74) *Attorney, Agent, or Firm* — Louis J. Percello; Otterstedt, Ellenbogen & Kammer, LLP

(57) ABSTRACT

A high resolution active matrix backplane is fabricated using techniques applicable to flexible substrates. A backplane layer including active semiconductor devices is formed on a semiconductor-on-insulator substrate. The backplane layer is spalled from the substrate. A frontplane layer including passive devices such as LCDs, OLEDs, photosensitive materials, or piezo-electric materials is formed over the backplane layer to form an active matrix structure. The active matrix structure may be fabricated to allow bottom emission and provide mechanical flexibility.

4 Claims, 5 Drawing Sheets

(56) References Cited

U.S. PATENT DOCUMENTS

| | | |
|---|---|---|
| 2004/0142502 A1 | 7/2004 | Yoo et al. |
| 2004/0183133 A1* | 9/2004 | Takafuji et al. ............... 257/347 |
| 2004/0235284 A1* | 11/2004 | Chan et al. .................... 438/585 |
| 2005/0156247 A1* | 7/2005 | Chu et al. ...................... 257/347 |
| 2006/0290276 A1 | 12/2006 | Cok et al. |
| 2007/0012955 A1 | 1/2007 | Ihama |
| 2007/0029545 A1 | 2/2007 | Striakhilev et al. |
| 2008/0242112 A1 | 10/2008 | Wu et al. |
| 2008/0245968 A1 | 10/2008 | Tredwell et al. |
| 2009/0267504 A1 | 10/2009 | Yamazaki et al. |
| 2010/0248403 A1 | 9/2010 | Hatano et al. |
| 2010/0301398 A1 | 12/2010 | Rothberg et al. |
| 2010/0307572 A1* | 12/2010 | Bedell et al. ................. 136/255 |
| 2010/0307591 A1* | 12/2010 | Bedell et al. ................. 136/262 |
| 2010/0308335 A1 | 12/2010 | Kim et al. |
| 2010/0310775 A1* | 12/2010 | Bedell et al. ............... 427/383.3 |
| 2010/0311250 A1* | 12/2010 | Bedell et al. ................. 438/759 |
| 2011/0006336 A1 | 1/2011 | Lee et al. |
| 2011/0025957 A1 | 2/2011 | Huang |
| 2011/0048516 A1* | 3/2011 | Bedell et al. ................. 136/255 |
| 2011/0048517 A1* | 3/2011 | Bedell et al. ................. 136/255 |
| 2011/0049577 A1* | 3/2011 | Or-Bach et al. ............... 257/209 |
| 2011/0090143 A1 | 4/2011 | Paek et al. |
| 2011/0122633 A1 | 5/2011 | Han et al. |
| 2011/0156062 A1 | 6/2011 | Kim et al. |
| 2011/0171763 A1 | 7/2011 | Lee et al. |
| 2011/0193067 A1 | 8/2011 | Lee et al. |
| 2011/0223697 A1 | 9/2011 | Yong-Hwan et al. |
| 2012/0013968 A1 | 1/2012 | Park et al. |
| 2012/0037916 A1 | 2/2012 | Song et al. |
| 2012/0061759 A1* | 3/2012 | Cheng et al. .................. 257/347 |
| 2012/0100647 A1 | 4/2012 | Kim et al. |
| 2012/0114872 A1 | 5/2012 | Lu et al. |
| 2012/0217622 A1* | 8/2012 | Bedell et al. .................. 257/632 |
| 2012/0235138 A1 | 9/2012 | Shieh et al. |
| 2012/0322183 A1 | 12/2012 | Hong et al. |
| 2013/0005116 A1* | 1/2013 | Bedell et al. .................. 438/462 |
| 2013/0052798 A1* | 2/2013 | Bedell et al. .................. 438/458 |
| 2013/0056802 A1* | 3/2013 | Cheng et al. .................. 257/288 |
| 2013/0140547 A1 | 6/2013 | Lee et al. |
| 2013/0189804 A1 | 7/2013 | Marchena et al. |
| 2013/0193564 A1 | 8/2013 | Liu et al. |

OTHER PUBLICATIONS

Holman, Michael "Sorting Hype from Reality in Printed, Organic, and Flexible Display Technologies" luxresearch Dec. 2010 pp. 1-12 available online at http://luxresearch.web8.hubspot.com/Portals/86611/docs/research%20downloads/ lux_research_sorting _hype from _reality _print ed _organic _and _display _technologies[1].pdf.

Ricklin, Jennifer "Flexible Electronics The Next Big Thing for the Past 100 Years" Proceedings of The Flexible Electronics and Displays Conference and Exhibition 2012 Feb. 9, 2012 pp. 1-62.

* cited by examiner

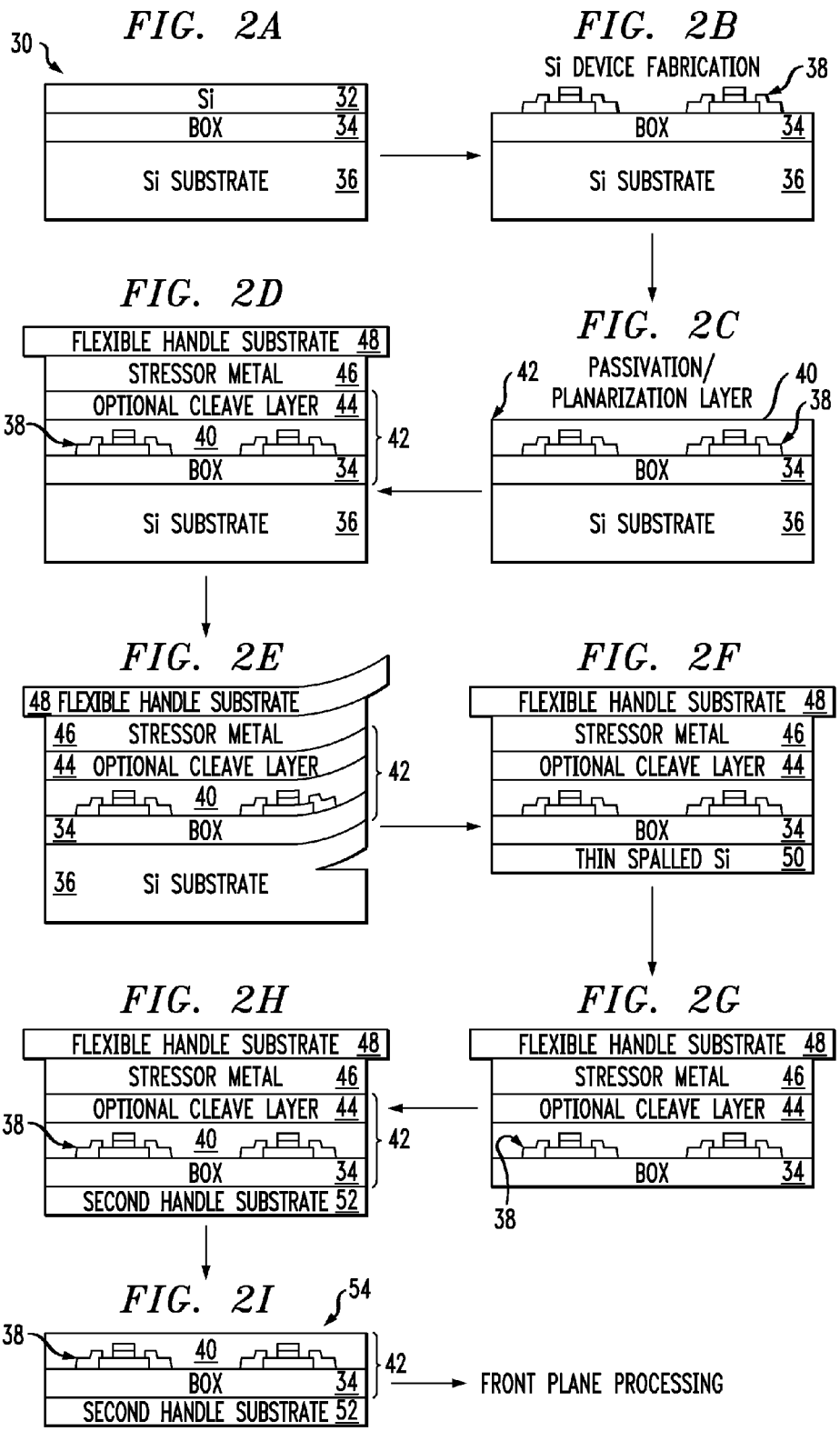

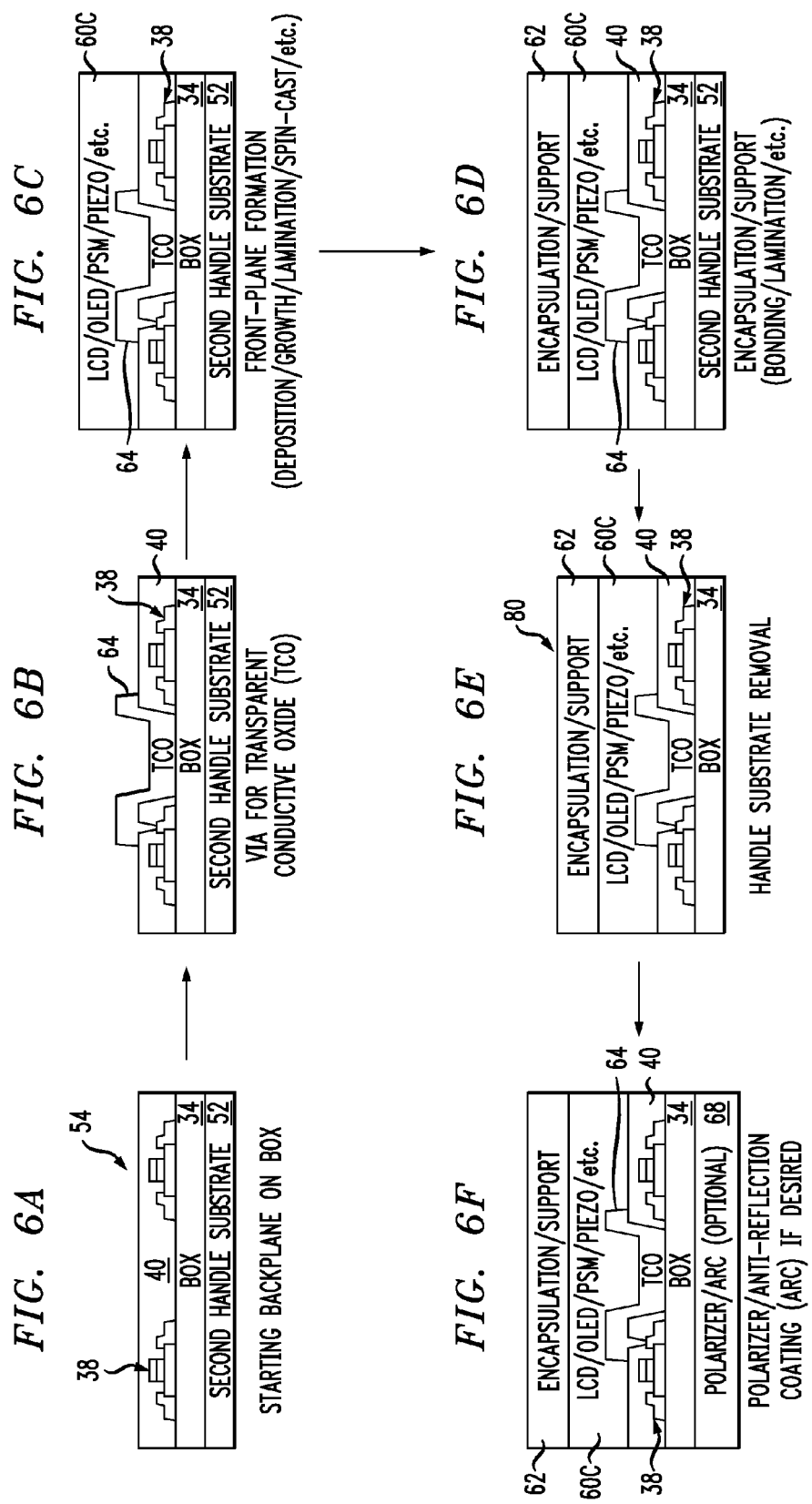

SEMICONDUCTOR ACTIVE MATRIX ON BURIED INSULATOR

CROSS-REFERENCE TO RELATED APPLICATION

This application is a continuation of U.S. patent application Ser. No. 13/472,584 filed May 16, 2012, the complete disclosure of which is expressly incorporated herein by reference in its entirety for al purposes.

FIELD

The present disclosure relates to the physical sciences and, more particularly, to active matrix structures and their fabrication.

BACKGROUND

Active matrix devices such as displays (e.g. televisions, laptop monitors), imagers (e.g. x-ray imagers) and sensors typically use hydrogenated amorphous silicon (a-Si:H) and, in some applications, low-temperature poly-silicon (LTPS) thin-film transistor (TFT) backplanes on glass or, for flexible devices, clear plastic. However, for very high resolution applications (>1000 pixels per inch (ppi)), such as microdisplays or pico-projectors, the carrier mobility of a-Si:H is too low to provide sufficient drive current at short TFT channel widths. LTPS is more expensive than a-SI:H, but capable of providing higher drive currents. The device-to-device variation of threshold voltage and mobility in LTPS transistors require compensation circuitry that limits the resolution of the active matrix. Single crystalline silicon (c-Si) has been used as an alternative for very high resolution backplanes but processing c-Si requires high temperatures not compatible with glass substrates currently used in manufacturing a-Si:H or LTPS devices or clear plastic substrates that may be used.

BRIEF SUMMARY

In accordance with the principles discussed herein, fabrication methods are disclosed for fabricating backplane structures and active matrix structures employing backplane and frontplane structures.

A method provided that includes fabricating a first backplane structure on a support substrate by forming a backplane for an active matrix on a semiconductor-on-insulator wafer, the wafer including a support substrate and a buried insulator layer, and forming an insulating layer on the backplane. The method further includes forming a metal layer on the first backplane structure and spalling the first backplane structure, the metal layer and a residual layer from the support substrate by exerting a force on the metal layer via a flexible handle.

A further method comprises obtaining a structure including a semiconductor-on-insulator wafer, the wafer including a support substrate and a buried insulator layer above the support substrate, a backplane comprising active semiconductor devices formed on the wafer, and an insulating layer formed on the backplane, wherein a first backplane structure includes the backplane, the insulating layer, and a wafer portion above the support substrate of the semiconductor-on-insulator wafer. The method further includes forming a metal layer on the first backplane structure and then spalling the first backplane structure, the metal layer and a residual layer from the support substrate by exerting a force on the metal layer via a flexible handle.

A further method comprises obtaining a backplane structure comprising a backplane layer including a plurality of thin film transistors on a semiconductor layer, a buried insulator layer beneath the backplane layer, an insulating layer on the backplane layer, and a handle substrate adjoining the buried oxide layer, forming one or more vias in the insulating layer on the backplane layer, forming a transparent conductive material layer over the first backplane structure, and forming a frontplane on the transparent conductive material layer to form an active matrix structure with the backplane.

An exemplary structure in accordance with certain aspects of the disclosure includes a semiconductor-on-insulator wafer, the wafer including a support substrate and a buried insulator layer, a backplane including an array of transistors formed on the wafer, and an insulating layer formed on the backplane. The backplane, insulating layer and a wafer portion above the support substrate comprise a first backplane structure. The structure further includes a metal layer formed on the first backplane structure and a flexible handle substrate bonded to the metal layer. The insulating layer of the structure has sufficient adhesion to the wafer and a fracture toughness value to allow spalling the first backplane structure, the metal layer and a residual layer from the silicon substrate by exerting a force on the metal layer via the flexible handle substrate.

A second exemplary structure comprises a substrate including a buried insulator layer and a semiconductor layer, a backplane layer comprising an array of thin film transistors formed on the substrate, an insulating layer formed on the backplane layer, and a handle substrate formed on the buried insulator layer of the substrate.

An active matrix structure is provided in accordance with a further embodiment. The active matrix structure comprises a substrate including a buried insulator layer and a semiconductor layer adjoining the buried insulator layer, a backplane layer formed on the substrate, the backplane layer including an array of active semiconductor devices, and an insulating layer formed on the backplane layer, the insulating layer including one or more vias. A transparent conductive material layer adjoins the insulating layer and electrically contacts the backplane layer. A frontplane layer formed on the transparent conductive material layer includes a plurality of passive devices such that the passive devices are addressable by the active semiconductor devices in the backplane layer. An encapsulation layer is formed on the frontplane layer.

One or more of the structures provided herein may include a buried insulator layer that is transparent and/or an encapsulation layer that is transparent and/or flexible. In some structures, the transparent conductive material layer directly contacts the buried insulator layer and functions as a bottom electrode for the passive devices in the frontplane layer.

As used herein, "facilitating" an action includes performing the action, making the action easier, helping to carry the action out, or causing the action to be performed. Thus, by way of example and not limitation, instructions executing on one processor might facilitate an action carried out by instructions executing on a remote processor, by sending appropriate data or commands to cause or aid the action to be performed. For the avoidance of doubt, where an actor facilitates an action by other than performing the action, the action is nevertheless performed by some entity or combination of entities.

Substantial beneficial technical effects are provided by the exemplary structures and methods disclosed herein. For example, one or more embodiments may provide one or more of the following advantages:

Enhanced efficiency through bottom-emission;
Applicable to flexible substrates;
High resolution;
Bifacial display/imaging applications.

These and other features and advantages of the disclosed methods and structures will become apparent from the following detailed description of illustrative embodiments thereof, which is to be read in connection with the accompanying drawings.

BRIEF DESCRIPTION OF THE DRAWINGS

FIGS. 2A-I show a flow diagram of a fabrication method for making a backplane structure;

FIGS. 6A-F show a flow diagram of frontplane formation following the backplane fabrication methods illustrated in FIG. 2A-I or 3A-D.

DETAILED DESCRIPTION

Figure 1A:
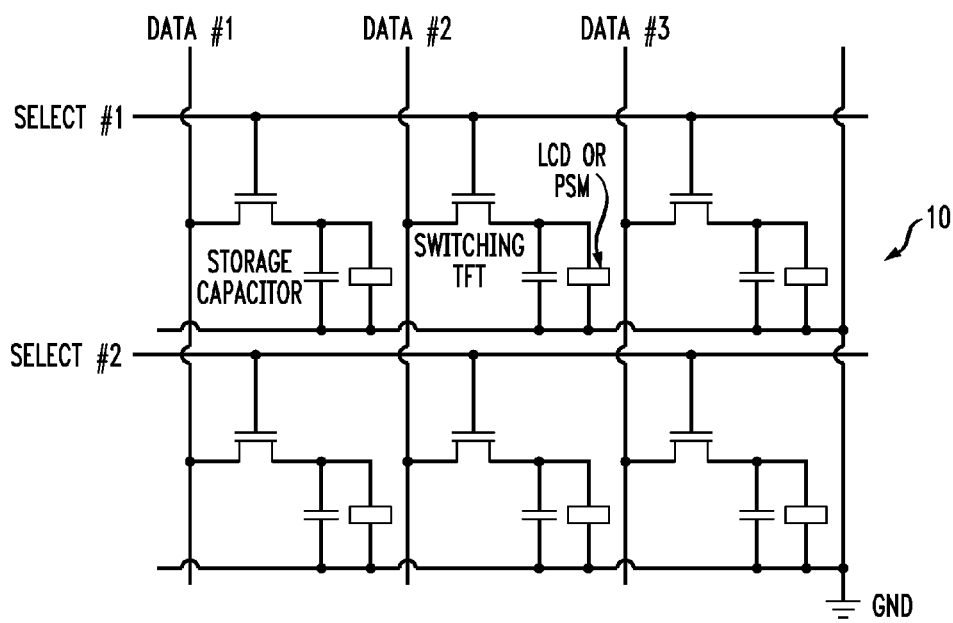
FIG. 1A shows a schematic illustration of a 3×2 active matrix LCD or imager array circuit with a 1-TFT pixel structure.
Figure 1B:
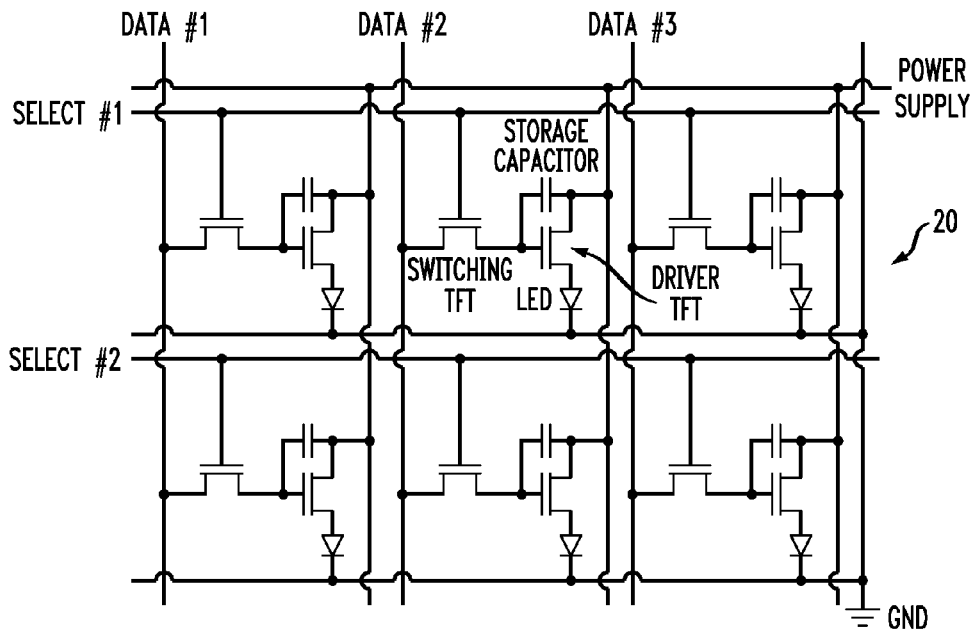
FIG. 1B shows a schematic illustration of a circuit including a 3×2 active matrix LED array with a 2-TFT pixel structure.

A method is disclosed for forming a high resolution active matrix backplane structure which is applicable to flexible as well as rigid substrates. A backplane refers to an array of transistors (active devices) used for addressing and programming passive devices such as light emitting diodes, liquid crystal displays, photosensitive materials (PSMs, e.g. for x-ray imaging), or sensors (e.g. piezoelectric materials for sensing pressure). The backplane also contains address lines, program lines, power supply lines, and typically storage capacitors which are fabricated using the same process technology as that of the transistors. The passive devices addressed/programmed by the backplane are typically referred to as the frontplane. An active matrix refers to the combination of a backplane and a frontplane. Schematic pixel circuits of typical active-matrix arrays comprised of liquid crystal displays, photo-sensitive materials (e.g. amorphous Se and CdTe for x-ray imaging), piezoelectric materials for pressure sensing or LEDs (e.g. organic LEDs or OLEDs) are illustrated in FIGS. 1A and 1B. The circuit 10 illustrated in FIG. 1A is a 3×2 active matrix LCD or imager array. A switching thin film transistor (TFT) and a storage capacitor are operatively associated with LCD or PSM passive elements. Piezoelectric elements could replace the LCD/PSM elements to provide an active matrix pressure sensor. FIG. 1B shows a circuit 20 including both a switching TFT as well as a driver TFT associated with each LED. One TFT is employed to start and stop charging of a storage capacitor while the other functions as a voltage source to create a constant current for each pixel. In both cases, a frontplane of passive elements is integrated, e.g. laminated, onto a backplane including an array of TFT elements to control current flowing to the passive elements. The select and data lines respectively transfer the switching and programming/readout signals.

An exemplary schematic illustrating a method for fabricating a backplane structure is given in FIGS. 2A-I. The starting substrate in this example is a silicon-on-insulator (SOI) wafer 30 comprised of a thin crystalline silicon layer 32 on a buried oxide (BOX) insulator 34, which is in turn on a bulk silicon substrate 36 (FIG. 2A). The thickness of the semiconductor layer 32 is between 3 nm-30 μm in exemplary embodiments, but thicker or thinner layers may be usable in some applications. Relatively thin semiconductor layers facilitate the production of mechanically flexible active matrix structures as discussed further below. The insulator layer 34 in an exemplary embodiment is between 10-500 nm, but may also be thicker or thinner for some applications. Other semiconductor-on-insulator substrates may alternatively be employed, such as silicon-germanium-on-insulator (SGOI), germanium-on-insulator (GOI) and various III-V materials on insulating substrates. The bulk substrate 36 can be quartz or other materials as opposed to silicon. The semiconductor-on-insulator substrates may be produced using techniques known in the art. The buried insulator layer 34 in one exemplary embodiment is silicon dioxide, though other buried insulators such as boron nitride (BN) and aluminum oxide ($Al_2O_3$) may alternatively be employed. The size and shape of the wafer can be chosen by the manufacturer.

The SOI substrate is next processed using known device fabrication processes to form a backplane 38 comprised of an array of active semiconductor devices (transistors), capacitors, and addressing, programming and power lines as known in the art, depending on the application intended for the backplane (FIG. 2B). The backplane 38 is then coated with an insulating layer 40 serving as a passivation and/or planarization layer (FIG. 2C) to form a first backplane structure 42. Formation of first backplane structure may further include forming an optional cleave layer 44 on the insulating layer as shown in FIG. 2D. Accordingly, the first backplane structure 42 may or may not include a cleave layer 44. The insulating layer 40 chosen should have good adhesion with silicon in embodiments where silicon is employed. It should additionally have a fracture toughness value ($K_{Ic}$) at least comparable to that of silicon in embodiments where silicon is employed to facilitate spalling, as discussed further below. Silicon dioxide, silicon nitride and silicon oxy-nitride have fracture toughness values comparable to that of silicon and are accordingly among the materials that may be chosen for the insulating layer 40. Using typical insulator growth methods, such as chemical vapor deposition, adhesion between silicon and insulator materials such as silicon dioxide, silicon nitride and silicon oxy-nitride is satisfactory.

Fabrication of the first backplane structure 42 is followed by the formation of a stressor metal layer(s) 46 (e.g. nickel) and bonding of the stressor metal layer(s) to a flexible handle substrate 48, forming the structure shown in FIG. 2D. The optional cleave layer is comprised of a material (e.g. ZnO:Al (AZO), indium tin oxide (ITO), silicon nitride (SiN) or silicon dioxide ($SiO_2$)) having a lower fracture toughness value than that of the substrate material (in this exemplary embodiment Si) and the buried insulator (in this exemplary embodiment BOX). The flexible handle substrate (e.g. polyimide) is then used for detaching a thin layer of Si by spalling through the substrate as shown in FIG. 2E. The proper amount of stress to be applied to effect spalling at a desired location in the substrate 36 may vary depending on the construction of the first backplane structure 42.

As discussed above, spalling is facilitating by selecting an appropriate insulating layer 40 above the backplane layer. If the insulating layer has a fracture toughness value comparable to silicon, to the first order, the silicon/insulator stack of the exemplary structure can be treated as a single layer in calculating the depth of fracture as a function of stress applied by the stressor layer(s) 46. Therefore, a proper amount of stress can be considered for a desired fracture depth. If the insulating layer has a toughness value larger than that of silicon, the fracture will occur inside the silicon. However, the insulating layer should not have a toughness value materially smaller than that of silicon (or other substrate material, if employed) because the fracture will occur within the insulating layer instead of in the silicon substrate 36. The thickness of the metal stressor layer is an additional factor in determining where the fracture will occur in the substrate. Following spalling of the first backplane structure 42 and a thin, residual silicon layer 50 from the substrate 36, a structure as shown in FIG. 2F is obtained.

The thin Si residual layer 50 spalled from the Si substrate 36 is then removed using known techniques, e.g. by wet or dry etching to form the structure shown in FIG. 2G. A second handle substrate 52, which may or may not be flexible and can be comprised of, for example, glass, metal foil, or plastic, is then bonded to the insulator layer (BOX layer in this example) as shown in FIG. 2H. If the optional cleave layer is not employed, the flexible handle substrate 48 and the stressor metal 46 are then removed, e.g. by debonding the handle substrate followed by wet etching of the stressor metal layer(s) as schematically illustrated in FIG. 2I. The resulting backplane structure 54 includes the first backplane structure 42 mounted to the second handle substrate 52.

Figure 3A:
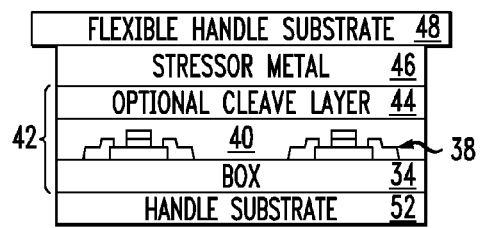
FIGS. 3A-D show a flow diagram of alternative fabrication steps including use of a cleave layer for making the backplane structure.
Figure 3B:
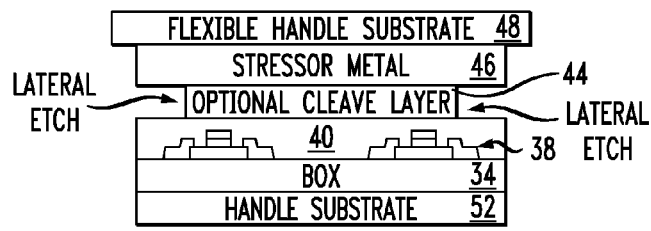
Figure 3C:
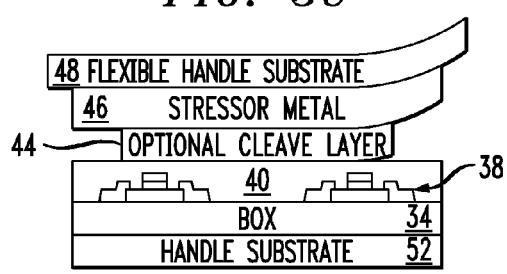

If the optional cleave layer 44 is employed, the process shown in FIGS. 3A-D facilitates removal of the flexible handle substrate 48 and stressor metal layer 46. FIG. 3A is the same as FIG. 2H and shows the cleave layer between the first backplane structure 42 and the stressor metal layer. The cleave layer has a lower fracture toughness value ($K_{Ic}$) than that of the host substrate material (silicon in this exemplary embodiment). Rather than debonding the handle substrate and etching the stressor metal layer, the exposed edges of the cleave layer 44 are laterally etched as shown in FIG. 3B. The lateral etch may be performed in an HF or HCl containing solution for either a ZnO:Al or ITO cleave layer. Following such etching, a shear stress is applied using the flexible handle substrate 48 as shown in FIG. 3C, spalling through the cleave layer 44 to remove the flexible handle substrate 48, the metal stressor layer(s) 46 and a portion of the cleave layer 44. Any residual portion of the cleave layer remaining on the first backplane structure 42 can be removed by using the same etching solution used to perform lateral etching as described above. The resulting structure 54 is the same as shown in FIG. 2I and is ready for further processing or formation of the frontplane.

Figure 4A:
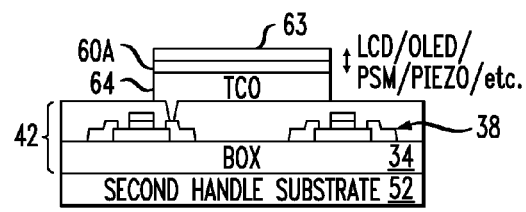
FIGS. 4A-C show exemplary active matrix structures illustrating the formation of frontplanes on the backplane structure.
Figure 4B:
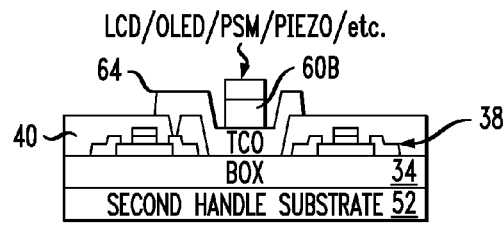
Figure 4C:
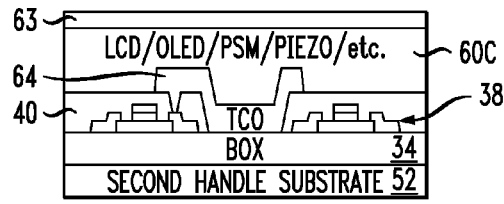
Figure 5A:
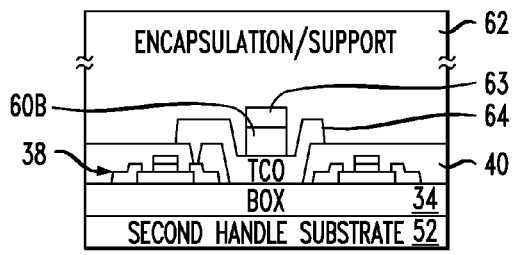
FIGS. 5A and 5B show exemplary active matrix structures following encapsulation of the frontplane of the active matrix structure shown in FIG. 4B and removal of the second handle structure, respectively.
Figure 5B:
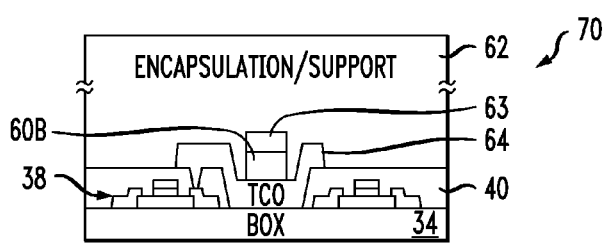

The insulating (passivation/planarization) layer 40 may be partially or entirely removed, thickened and/or treated for further planarization or surface topology modification before the formation of the frontplane, depending of the frontplane processing requirements, as known in the art. Also, depending on the frontplane processing requirements, the passivation/planarization layer 40 may be removed and another passivation/planarization layer comprised of a different material, layer thickness and/or surface finish/topology may be used instead. The passivation/planarization layer may be etched to form contact vias, as necessary, followed by edge smoothening of the contact vias, if necessary, as known in the art. The frontplane is then formed by lamination, spin coating, deposition, growth, and/or other techniques known in the art, followed by processing steps such as patterning and contact electrode formation depending on the type of the frontplane as known in the art. Three non-restrictive examples are illustrated schematically in the pixel level in FIGS. 4A-C for frontplanes 60A, 60B and 60C, respectively, having three different configurations. Any of the frontplanes can be a single layer or, more typically, multi-layer. The frontplane 60B is typically encapsulated (for environmental protection) as shown schematically for the structure of FIG. 4B in FIG. 5A. For mechanically flexible active-matrix applications, the encapsulation layer 62 is chosen to be a flexible material such as a polymer, as known in the art. In some applications, the encapsulation layer 62 may be used as a supporting substrate (or an additional supporting substrate may be bonded on top of the encapsulation layer) allowing the second handle substrate to be removed if desired. FIG. 5B shows the resulting active matrix structure 70 following removal of the second handle substrate 52. This is the preferred embodiment for most typical applications where optical transparency of the BOX layer or other buried insulator layer 34 is advantageous. For example in the case of LCDs, the required backlight illumination may be installed on the BOX side, allowing the light to enter the active matrix via the BOX layer 34. In the case of OLEDs, the transparency of the BOX layer allows the use of standard bottom-emission OLEDs (although top-emission or bifacial operation are also possible provided that the encapsulation/support layer 62 is chosen to be transparent). In the case of photo-detection or imaging applications, light may enter from the BOX side (or both sides if the top encapsulation/support layer(s) are transparent). In these applications, typically the bottom electrode of the passive material used for the frontplane and possibly some of the other electrodes and/or address/programming/power supply lines used in the backplane/frontplane may be comprised of transparent conductive materials such as transparent conductive oxides (TCO) due the simultaneous transparency and conductivity of these materials, as known in the art. Transparent conductive material layers 64 comprising transparent conductive oxides are shown in the schematic illustrations of the active matrix structures shown in FIGS. 4A-C and 5A-B. The top electrodes 63 for the passive devices can be metal or made from TCO or other transparent conductive materials.

FIGS. 6A-F show a flow chart that schematically illustrate exemplary frontplane formation starting with the backplane structure 54 resulting from the fabrication processes shown in FIGS. 2A-I and 3A-D. As shown in FIG. 6B, via formation through the insulating layer 40 is followed by formation of a transparent conductive material layer 64 such as a TCO layer that electrically contacts the backplane 38 through such vias. The designations of BOX and TCO in the figures is not intended to limit the particular layers to buried oxides and transparent conductive oxides, but only to indicate that such materials are suitable for use, respectively, in the buried insulator layer 34 and transparent conductive material layer 64 in the exemplary method and structures. The frontplane 60C is then formed over the transparent conductive material layer 64 and insulating layer 40 as shown in FIG. 6C by known methods such as deposition, lamination, and spin-casting. The transparent conductive material layer also directly contacts the buried oxide layer and forms the bottom electrode for the passive devices comprising the frontplane in one or more exemplary embodiments where the buried insulator layer is transparent. In other embodiments where light is not transmitted though the buried insulator layer, such as where the frontplane comprises piezoelectric material, direct contact between the transparent conductive material layer 64 and the buried insulator layer 34 is not required. As discussed above, the insulating layer 40 shown in FIGS. 6A-F, while designated by the same reference numeral as employed in FIGS. 2A-I, may or may not be the same insulating layer employed in the formation of the backplane structure 54 or may just be partially the same. An encapsulation/support layer 62 is secured to the frontplane 60C through lamination, bonding or other known techniques. As discussed above, this layer 62 may be flexible and transparent in some applications. Use of the encapsulation/support layer 62 facilitates removal (e.g. debonding) of the second handle substrate 52 as shown in FIG. 6E. A polarizer/anti-reflection coating 68 is formed on the buried insulator layer 34 of the active matrix structure 80 as shown in FIG. 6F. Such a coating is optional. If LCDs are employed in the frontplane, the required backlight illumination may be installed on the BOX side of the active matrix structure in an exemplary embodiment, allowing the light to enter the structure via the transparent BOX layer. In the case of OLEDs, the transparency of the buried insulator layer allows the use of standard bottom-emission OLEDs, although top-emission or bifacial operations are also possible provided that the encapsulation/support layer is transparent. If designed for photo-detection or imaging applications, light may enter from the buried insulator side or both sides if the top encapsulation/support layer 62 is also transparent. In these applications, typically the bottom electrode of the passive material used for the frontplane and possibly some of the other electrodes and/or address/programming/power supply lines used in the backplane or frontplane may be comprised of transparent conductive materials due to the simultaneous transparency and conductivity of these materials, as known in the art.

The active matrix structure 80 in this exemplary embodiment includes backplane transistors (addressing and switching) such as the thin film transistors shown in FIG. 1B in each pixel on a buried oxide layer, allowing bottom emission for display application or light to enter from the bottom for imaging applications. The structure 80 may be mechanically flexible by using fabrication methods employing a thin semiconductor layer and a flexible encapsulation/support layer 62. The frontplane 60C may include LCD arrays, OLED arrays, any suitable photosensitive material for imaging applications, or piezo-electric material for 2D pressure sensing, such sensing being facilitated by structure flexibility. Bifacial display/imaging applications are feasible using the techniques disclosed herein.

Given the discussion thus far, a method is provided that includes fabricating a first backplane structure on a support substrate by forming a backplane 38 for an active matrix on a semiconductor-on-insulator wafer 30, the wafer including a support substrate 32 and a buried insulator layer 34. An insulating layer is formed on the backplane. A metal layer 46 is formed on the first backplane structure, which may or may not include a cleave layer. The method further includes spalling the first backplane structure, the metal layer and a residual layer 50 from the support substrate by exerting a force on the metal layer via a flexible handle 48. The method may further include the step of bonding the flexible handle to the metal layer prior to spalling. The backplane in one exemplary embodiment is comprised of a plurality of thin film transistors. A further step may include removing the residual layer 50 from the first backplane structure as shown in FIG. 2G. The method may further include securing a second handle substrate 52 to the buried insulator layer 34 as shown in FIG. 2H. The method may further include removing the metal layer 46 and the flexible handle 48 from the first backplane structure 42 as shown in FIG. 2I. If a cleave layer 44 is employed to facilitate removal of the metal layer and flexible handle as shown in FIG. 3C, any residual cleave layer would be subsequently removed. An exemplary method may further include forming a frontplane 60A, 60B, 60C over the first backplane structure to form an active matrix structure with the backplane 38. It will be appreciated that the frontplane may be formed over the insulating layer 40 used in fabricating the first backplane structure, a new insulating layer following removal of the original insulating layer 40, or the original insulator following further processing.

In accordance with a further exemplary embodiment, a method comprises obtaining a structure including a semiconductor-on-insulator wafer 30, the wafer including a support substrate 36 and a buried insulator layer 34 above the silicon substrate, a backplane 38 comprising active semiconductor devices formed on the wafer, and an insulating layer 40 formed on the backplane, wherein a first backplane structure 42 includes the backplane, the insulating layer, and a wafer portion including the buried insulator layer above the support substrate 32 of the semiconductor-on-insulator wafer. Such a structure is shown in FIG. 2C. A metal layer 46 is formed on the first backplane structure. The method further includes spalling the first backplane structure, the metal layer and a residual layer 50 from the support substrate by exerting a force on the metal layer via a flexible handle 48. The semiconductor-on-insulator wafer includes a silicon semiconductor above the buried oxide layer in a further exemplary embodiment, wherein the backplane 38 adjoins the silicon semiconductor. The exemplary method may further include the steps of removing the residual layer, securing a second handle substrate 52 to the buried insulator layer 34, and removing the flexible handle 48 and the metal layer 46 from the first backplane structure. The method may further include forming a frontplane over the first backplane structure to form an active matrix structure with the backplane. As discussed above, the first backplane structure may include the original insulating layer at the time the frontplane is formed, a new insulating layer, or a modified original insulating layer.

Figure 3D:
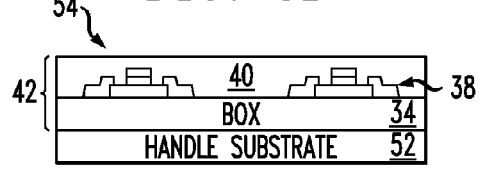

In accordance with another aspect of the disclosure, an exemplary method includes obtaining a backplane structure 54 comprising a backplane layer 38 including a plurality of thin film transistors on a semiconductor layer, a buried insulator layer 34 beneath the backplane layer, an insulating layer 40 on the backplane layer, and a handle substrate 52 adjoining the buried insulator layer. Such a structure 54 is shown in FIGS. 2I and 3D. One or more vias are formed in the insulating layer 40 on the backplane layer. A transparent conductive material layer 64 is formed over the first backplane structure, such as shown in FIG. 6B. The method further includes forming a frontplane on the transparent conductive material layer to form an active matrix structure with the backplane. The active matrix structure 80 shown in FIG. 6E is an example of a product that may be formed using this method. This or the other methods described above may include further forming a flexible and/or transparent encapsulation layer 62 over the frontplane.

A further exemplary embodiment provides a structure comprising a semiconductor-on-insulator wafer 30, the wafer including a support substrate 36 and a buried insulator layer 34, a backplane 38 including an array of transistors formed on the wafer, an insulating layer 40 formed on the backplane, the backplane, insulating layer and a wafer portion above the support substrate comprising a first backplane structure 42. The structure further includes a metal layer 46 formed on the first backplane structure and a flexible handle substrate 48 bonded to the metal layer. The insulating layer has sufficient adhesion to the wafer and a fracture toughness value to allow spalling the first backplane structure, the metal layer and a residual layer 50 from the support substrate by exerting a force on the metal layer via the flexible handle, as shown in FIGS. 2E and 2F. As discussed above, the metal layer may be attached directly to the insulating layer 40 or, in an alternative embodiment, to a cleave layer 44 formed on the insulating layer 40. In one exemplary embodiment, the semiconductor-on-insulator wafer comprises a crystalline silicon semiconductor layer adjoining the buried insulator layer, which may be a buried oxide layer. The crystalline silicon semiconductor layer has a thickness between 3 nm and 30 µm in another embodiment. The buried insulator layer has a thickness between 10-500 nm in a further embodiment and may comprise silicon dioxide. The backplane in an embodiment of the structure comprises a plurality of thin film transistors and capacitors.

A structure is provided in accordance with a further aspect that comprises a substrate including a buried insulator layer 34 and a semiconductor layer 32. A backplane layer 38 comprising an array of thin film transistors is formed on the substrate. An insulating layer 40 formed on the backplane layer is further provided. A handle substrate 52 is provided on the buried insulator layer of the substrate. Such as structure 54 is shown in the exemplary embodiment of FIG. 2I. The buried insulator layer has a thickness between 10-500 nm and the semiconductor layer has a thickness between 3 nm-30 µm in a further embodiment(s) of the structure and may further comprise silicon dioxide. One or more vias are present within the insulating layer and a transparent conductive material layer adjoins the insulating layer and electrically contacts the backplane in a further embodiment of the structure. The structure may further comprise a frontplane layer (60A, 60B, 60C) adjoining the transparent conductive material layer 64, the frontplane layer including a plurality of passive devices controllable by the array of thin film transistors in the backplane layer, such as shown in FIG. 6C. An encapsulation layer 62 adjoins the frontplane layer in accordance with a further embodiment shown by way of example in FIG. 6D. The frontplane layer comprises a plurality of layers in a further embodiment. The buried insulator layer is transparent and the transparent conductive material layer directly contacts the buried insulator layer and functions as a bottom electrode for the passive devices of the frontplane layer in some embodiments. The passive devices may include light emitting devices such as LEDs or OLEDs in accordance with any of the embodiments. The passive devices may include piezoelectric devices in accordance with any exemplary embodiment. The encapsulation layer is flexible in any embodiment where flexibility of an active matrix structure is desired. The buried insulator layer has a thickness between 10-500 nm, the semiconductor layer has a thickness between 3 nm-30 µm, the buried insulator layer is transparent, and the insulating layer is flexible in accordance with a further embodiment of the structure.

An active matrix structure is provided in accordance with a further exemplary embodiment. The exemplary active matrix structure includes a substrate including a buried insulator layer 34 and a semiconductor layer 32 adjoining the buried insulator layer, a backplane layer 38 formed on the substrate, the backplane layer including an array of active semiconductor devices, and an insulating layer formed on the backplane layer, the insulating layer including one or more vias. The active matrix structure further includes a transparent conductive material layer 64 adjoining the insulating layer 40 and electrically contacting the backplane layer, a frontplane layer formed on the transparent conductive material layer and including a plurality of passive devices such that the passive devices are addressable by the active semiconductor devices in the backplane layer, and an encapsulation layer 62 formed on the frontplane layer. Such an active matrix structure 80 is shown in the exemplary embodiment of FIG. 6E. The buried insulator layer of a further embodiment(s) of the active matrix structure is transparent and the transparent conductive material layer directly contacts the buried insulator layer and is functional as a bottom electrode for the passive devices in the frontplane layer. The encapsulation layer is flexible in one or more embodiments of the active matrix structure. In accordance with one or more further embodiments, the buried insulator layer has a thickness between 10-500 nm and the semiconductor layer has a thickness between 3 nm-30 µm. The active semiconductor devices include thin film transistors in one or more embodiments of the active matrix structure. The active matrix structure includes organic light emitting diodes in accordance with one or more embodiments. The active matrix structure further includes an antireflective coating or a polarizing film 68 on the buried insulator layer 34 in accordance with one or more embodiments, such as shown in FIG. 6F. The buried insulator layer may be transparent, the encapsulation layer flexible, the buried insulator layer may have a thickness between 10-500 nm, the semiconductor layer may have a thickness between 3 nm-30 µm, and the active semiconductor devices may include thin film transistors and capacitors in accordance with any exemplary embodiment of the active matrix structure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. Terms such as "above" and "below" are generally employed to indicate relative positions as opposed to relative elevations unless otherwise indicated.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:
1. A structure comprising:
a semiconductor-on-insulator wafer, the wafer including a support substrate and a buried insulator layer;
a backplane including an array of transistors formed on the wafer;
an insulating layer formed on the backplane, wherein the backplane, the insulating layer and a wafer portion above the support substrate comprise a first backplane structure;
a metal layer formed on the first backplane structure, and
a flexible handle substrate bonded to the metal layer,
wherein the insulating layer has sufficient adhesion to the wafer and a fracture toughness value to allow spalling the first backplane structure, the metal layer and a residual layer from the support substrate by exerting a force on the metal layer via the flexible handle substrate.

2. The structure of claim 1, wherein the buried insulator layer includes a buried oxide layer having a thickness between 10-500 nm.

3. The structure of claim 2, wherein the buried oxide layer comprises silicon dioxide.

4. The structure of claim 1, wherein the backplane comprises a plurality of thin film transistors and capacitors.

* * * * *